United States Patent [19]
Xie et al.

[11] Patent Number: 5,990,552
[45] Date of Patent: *Nov. 23, 1999

[54] APPARATUS FOR ATTACHING A HEAT SINK TO THE BACK SIDE OF A FLIP CHIP PACKAGE

[75] Inventors: Hong Xie, Phoenix, Ariz.; Michael Brownell, Los Gatos, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/797,773

[22] Filed: Feb. 7, 1997

[51] Int. Cl.⁶ .................................................. H01L 23/34
[52] U.S. Cl. ........................................ 257/718; 257/712
[58] Field of Search ................... 257/718, 712, 257/713, 617, 706; 361/710, 718, 719

[56] References Cited

U.S. PATENT DOCUMENTS

| | | | |
|---|---|---|---|
| 5,280,409 | 1/1994 | Selna et al. | 361/720 |
| 5,396,402 | 3/1995 | Perugini et al. | 361/704 |
| 5,570,271 | 10/1996 | Lavochkin | 361/704 |

FOREIGN PATENT DOCUMENTS

2-83955  3/1990  Japan ...................................... 257/718

OTHER PUBLICATIONS

*ICMCM Proceedings '92*, "Backside Cooling of Flip Chip Devices in Multichip Modules", pp. 828–839, 1992.

*Primary Examiner*—Nathan K. Kelley
*Attorney, Agent, or Firm*—Blakely, Sokoloff, Taylor & Zafman LLP

[57] ABSTRACT

An apparatus for removing heat from the backside of a packaged flip chip. In one embodiment, the top side of an integrated circuit die is mechanically and electrically coupled to the top surface of a package substrate via a plurality of solder bump interconnections. A heatsink is supported above the backside surface of the die and the package substrate by standoffs. The height of the standoffs is selected to produce a gap between the heatsink and the backside of the die. The gap is filled with a highly conductive heat transfer medium, such as a thermal grease, to provide a heat path between the die and the heatsink. A spring clip flexibly attaches the heatsink to the package by providing a force to the heatsink to seat the standoffs against the top surface of the package substrate.

26 Claims, 3 Drawing Sheets

APPARATUS FOR ATTACHING A HEAT SINK TO THE BACK SIDE OF A FLIP CHIP PACKAGE

FIELD OF THE INVENTION

The present invention relates generally to semiconductor devices, and more particularly to heatsinks for flip chip devices.

BACKGROUND OF THE INVENTION

Within the integrated circuit industry there is a continuing effort to increase integrated circuit speed as well as device density. As a result of these efforts, there is a trend towards using flip chip technology when packaging complex high speed integrated circuits. Flip chip technology is also known as control collapse chip connection (C4) technology. In C4 technology, the integrated circuit die is flipped upside down. This is opposite to how integrated circuits are typically packaged today using wire bond technology. By flipping the integrated circuit die upside down, ball bonds may be used to provide direct electrical connections between the die and the package. Unlike wire bond technology, which only allows bonding along the periphery of the integrated circuit die, C4 technology allows connections to be placed anywhere on the integrated circuit die surface. This leads to a very low inductance power distribution to the integrated circuit which is another major advantage of C4 technology.

As integrated circuit technology has improved, substantially greater functionality has been incorporated into the devices. As integrated circuits have expanded in functionality, the size of the devices have diminished resulting in higher clocking frequencies and increased power consumption. As a consequence, the integrated circuit devices of today generate more heat while possessing smaller surface areas to dissipate the heat. Therefore, it is important to have a high rate of heat transfer from the integrated circuit package to maintain the junction temperatures of the integrated circuit within safe operating limits. Excessive junction temperatures may affect the performance of the circuit and cause permanent degradation of the chip.

In wire bond technology, the chip is attached to the bottom of the package which is usually a heat slug or a heat spreader. The heat slug or spreader provides a thermal interface to attach heatsinks. Since the heat slug and spreader possess a high degree of mechanical strength, a heatsink can be directly attached to either of these devices. The slug or spreader thus protects the die from outside forces that might otherwise damage the die.

In contrast to wire bond technology, a flip chip is attached to a package via a plurality of fragile solder bump interconnections. Since the force needed to hold a heatsink in place is typically 10–20 lbs, the direct attachment of a heatsink to the backside of flip chip may crush the die or cause a solder bump interconnection to crack or break. Although an underfill material may be placed under the die to cushion the solder bumps from the force being applied to them, the direct application of force onto the contact bumps is highly undesirable.

FIG. 1 illustrates a prior art approach to removing heat from the backside of a flip chip. As shown in FIG. 1, a flip chip 102 is mounted onto a ceramic package substrate 104 via a plurality of solder bump interconnections 106. A ceramic cap 108 is attached to the perimeter of the substrate generally by a solder seal 105. The inner height of cap 108 is designed to be slightly greater than the height of die 102. A thermal grease 112 is positioned between the backside of die 102 and cap 108 to provides a heat flow path from the die to the ceramic cap. The thickness of thermal grease 112 is commonly referred to as the "bond line thickness." A finned heatsink 110 is typically attached to the top of cap 108 by solder 114. Because present day integrated circuit devices dissipate considerably more power than those in the past, it is necessary to optimize the heat removal capability of the packages that house these devices. As such, the bond line thickness between the cap and die must be held to an absolute minimum.

Although the use of a cap protects the die from external forces, it limits the package's ability to remove heat from the die by increasing the thermal resistance of the flow path between die 102 and heatsink 110. For heat to escape from the backside surface of die 102 to heatsink 110 it must first pass through thermal grease 112, cap 108, solder 114 and the boundary interfaces of each of these materials. As a result, the thermal performance of the capped package is limiting.

The use of a capped package also requires that the package substrate and cap have matching coefficients of expansion in order to maintain a proper bond line thickness between the backside of the die and the cap. For this reason, the package substrate and cap are almost always made of a ceramic material. The trend in the integrated circuit industry, however, is to move away from the use of ceramic packages since the costs of these packages are relatively high. Ceramic packages are also heavy. Instead, lighter and less expensive plastic packages are now being used to house integrated circuit chips. The use of caps in conjunction with plastic packages introduces several problems. First, since a cap must be thermally conductive, it is nearly impossible to match the coefficient of expansion of the cap with that of a plastic substrate. In addition, plastic substrates are not as flat and rigid as their ceramic counterparts. These problems preclude the application of a cap to a plastic package since the bond line thickness between the cap and the backside of a die cannot be properly controlled to within the strict tolerances required by today's high powered circuits.

Therefore, what is needed is an apparatus for removing heat from the backside of a packaged flip chip.

SUMMARY OF THE INVENTION

An apparatus for removing heat from the backside of a packaged flip chip is disclosed.

In one embodiment, the top side of an integrated circuit die is mechanically and electrically coupled to the top surface of a package substrate via a plurality of solder bump interconnections. A heatsink is supported above the backside surface of the die and the package substrate by standoffs. The height of the standoffs is selected to produce a gap between the heatsink and the backside of the die. The gap is filled with a highly conductive heat transfer medium, such as a thermal grease, to provide a heat path between the die and the heatsink. A spring clip flexibly attaches the heatsink to the package by providing a force to the heatsink to seat the standoffs against the top surface of the package substrate.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus for removing heat from the backside of a packaged flip chip is described. In the following description, numerous specific details are set forth such as material types, dimensions, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. This discussion will mainly be limited to those needs associated with removing heat from the backside of a flip chip that is housed within a plastic land grid array (PLGA) package. It will be recognized, however, that such focus is for descriptive purposes only and that the apparatus and methods of the present invention are applicable to other types of packages.

Figure 1:
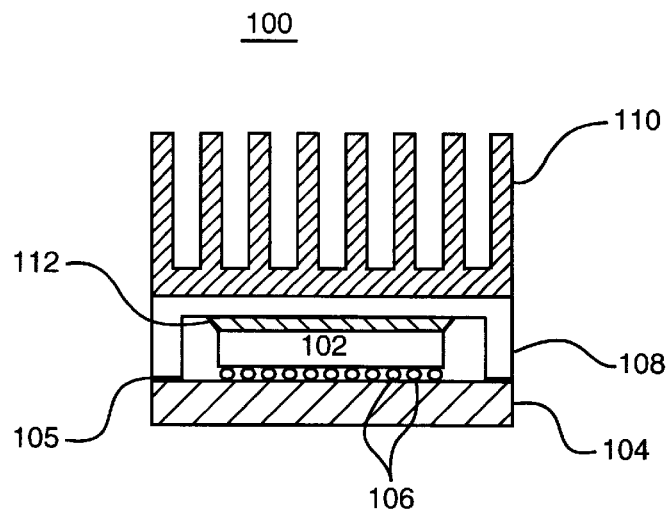
FIG. 1 illustrates a prior art flip chip package.
Figure 2:
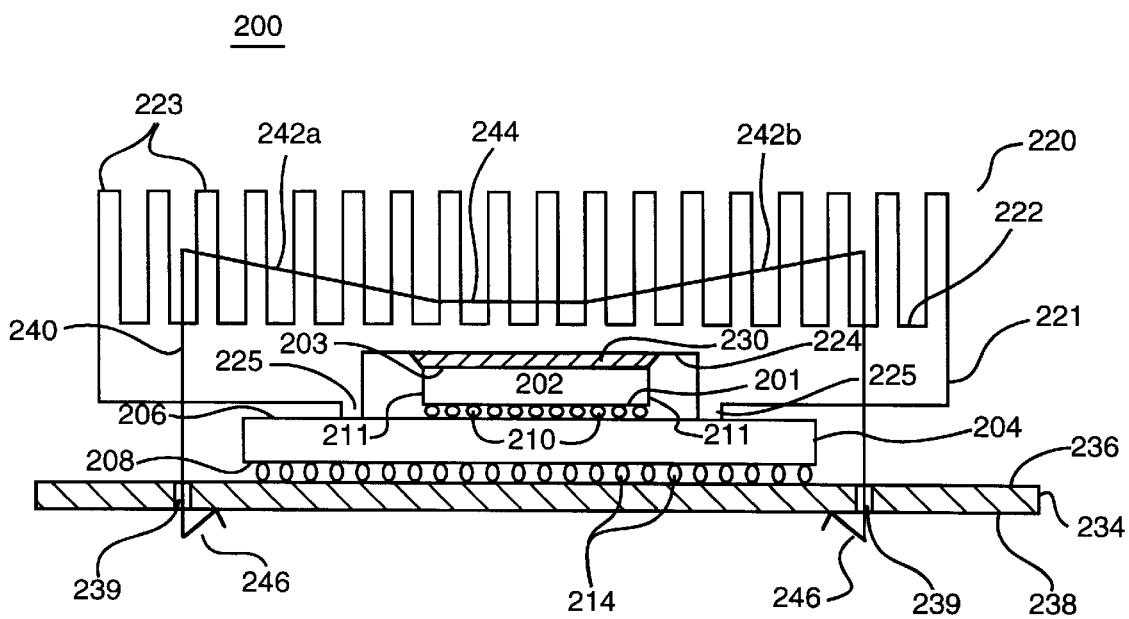
FIG. 2 illustrates a semiconductor device in accordance with one embodiment of the present invention.

FIG. 2 illustrates a side view of a semiconductor device 200 in one embodiment of the present invention. As shown in FIG. 2, a package 204 that houses a C4 mounted integrated circuit die (flip chip) 202 is attached to a printed circuit board 234. In one embodiment, package 204 is mechanically and electrically coupled to the top surface 236 of printed circuit board 234 via a plurality of solder bump interconnections 214. Note, however, that the present invention is not limited by the manner in which the integrated circuit package is attached to the printed circuit board. The top-side surface 201 of die 202 is mechanically and electrically attached to the top surface 206 of package 204 by solder bump interconnections 210.

A heatsink 220 is supported above die 202 and substrate 204 by standoffs 225. The heatsink includes a baseplate 221 having a top surface 222 and a bottom surface 224. In one embodiment, heatsink 220 includes a plurality of spaced apart fins 223 that extend upward from top surface 222. The height of standoffs 225 is selected to produce a small gap between bottom surface 224 of heatsink 220 and the backside surface 203 of die 202. A thermal grease 230, or other compliant thermal conductor material, fills the gap to provide a heat path between the die and heatsink. The width of the gap must be precisely controlled in order to achieve two competing objectives. First, the width must be large enough to ensure that the bottom surface 224 of the heatsink baseplate 221 does not push directly against the backside surface 203 of die 202 during the thermal cycling of the apparatus. Secondly, the width of the gap must be held to an absolute minimum in order to minimize the bond line thickness of the thermal media (grease) disposed between the two surfaces. Maintaining the bond line thickness at a minimum is crucial to the thermal performance of the apparatus. The importance of maintaining a proper bond line thickness is accentuated by the high heat dissipating circuits of today. In one embodiment, the width of the gap between surfaces 203 and 224 is maintained between 0.003 to 0.005 inches.

Figure 3:
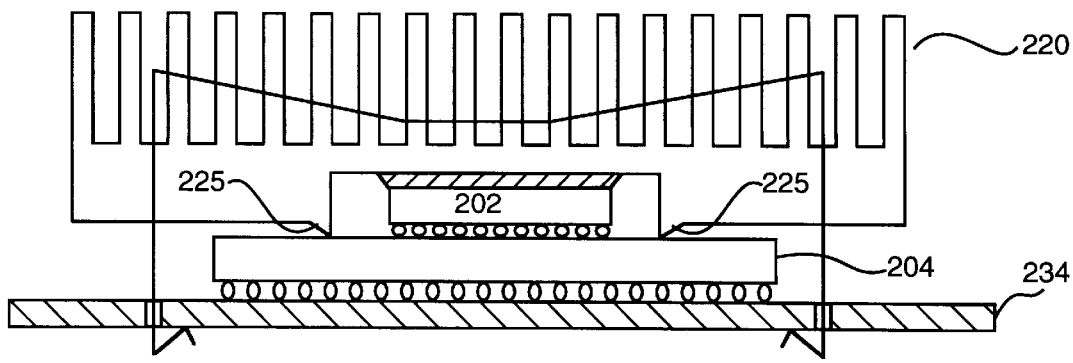
FIG. 3 illustrates another embodiment of the present invention.

As previously discussed, the trend in the integrated circuit industry is to house integrated circuit dies in plastic packages rather than the more costly and heavy ceramic packages. As such, package 204 will generally comprise a plastic substrate. Heatsink 220, on the other hand, must be made of a high thermally conductive material, such as a metal. Generally, heatsink 220 is made of aluminum because of its light weight and ability to conduct heat. The difference in the coefficients of thermal expansion between a plastic and a metal, such as aluminum, is very large. To offset the effects of the expansion mismatch between heatsink 220 and package 204, two important features are incorporated into the design of standoffs 225. First, standoffs 225 are positioned as close as possible to the sides 211 of die 202. By positioning the standoffs in close proximity to the die, warping or bending of the package substrate 204 will have a diminished effect on the bond line thickness of thermal grease 230. The manner in which the standoffs 225 contact the top surface 206 of package 204 is also controlled. For instances, in one embodiment, standoffs 225 make point contact with the top surface 206 of package 204 as illustrated in FIG. 3. By minimizing the contact area between heatsink 220 and package 204, the effects of any expansion mismatch are effectively reduced.

Figure 4:
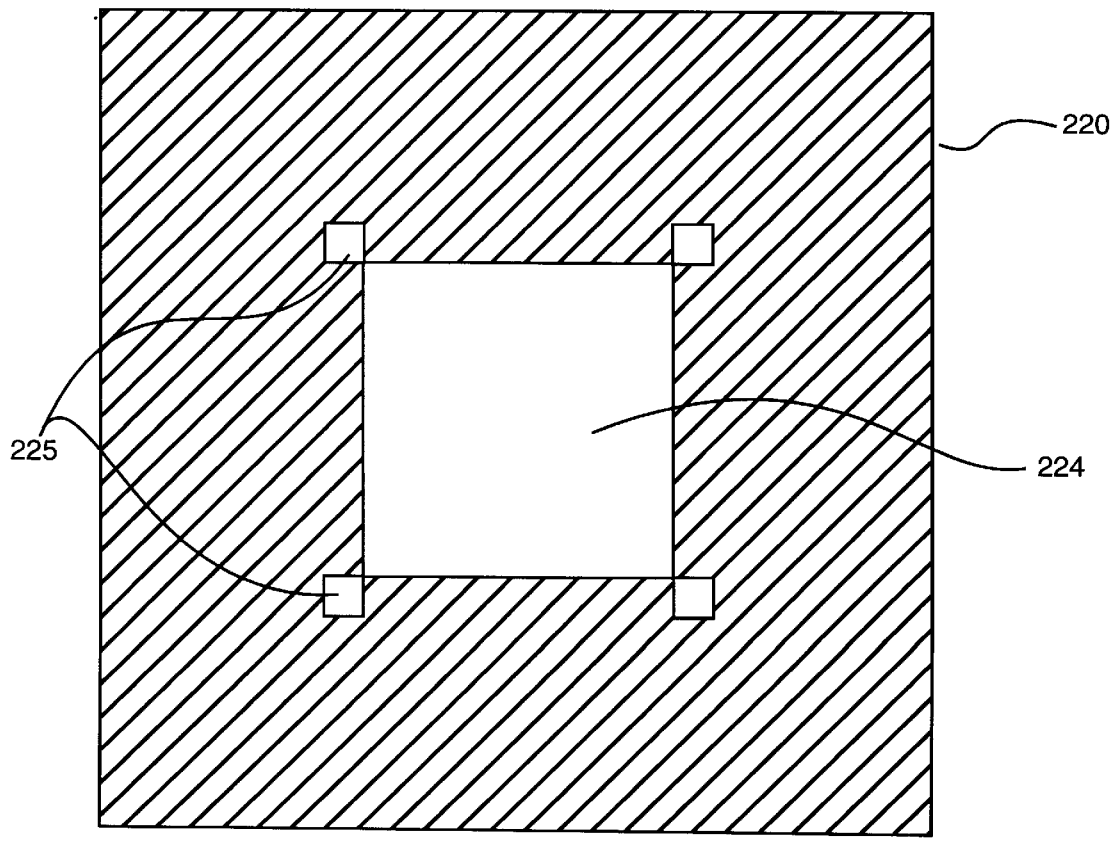
FIG. 4 illustrates a bottom view of a heatsink in one embodiment of the present invention.

In one embodiment of the present invention, standoffs 225 are positioned symmetrically about die 202. FIG. 4 illustrates a bottom view of heatsink 220 in one embodiment of the present invention. Note, however, that a variety of standoff configurations may be used in the implementation of the present invention. Standoffs 225 may be integral to heatsink 220, or they may comprise individual columns that are attached to the bottom surface of the heatsink or to the substrate onto which the chip is C4 mounted.

Since the difference in the coefficients of thermal expansion between package 204 and heatsink 220 is typically large, it is necessary that the heatsink attachment method possess a certain degree of flexibility. Otherwise, the ability to maintain a proper bond line thickness between the heatsink 220 and die 202 becomes a formidable task. In one embodiment, a heatsink clip 240 is used to secure heatsink 220 to package 204. Clip 240 includes a substantially flat cross member 244 and a pair of legs 242a and 242b extending outward from either side of the cross member. Each of legs 242a and 242b terminate at hooks 246a and 246b, respectively. Attachment of heatsink 220 to package 204 is achieved by placing clip 240 on top of heatsink 220 such that cross member 244 is positioned substantially center to the heatsink. Once the clip is properly positioned, the spring clip legs 242a and 242b are compressed to enable the insertion of hooks 246a and 246b into apertures 239 provided within printed circuit board 234. Hooks 246a and 246b bear against the bottom surface 238 of printed circuit board 234 to provide a force to the top surface 222 of heatsink 220, forcing the heatsink standoffs 225 to seat against the top surface 206 of package 204.

In addition to the features already discussed, the heatsink attachment method of the present invention provides the semiconductor device with a high degree of flexibility. This flexibility permits the bond line thickness to be held to within a tight tolerance, thus enhancing the thermal performance of the apparatus. In addition, since the clip attachment allows relative movement between the die and heatsink, the problem of thermal grease pump out is relieved.

In one embodiment, two spring clips may be used to secure the heatsink 220 to package 204. In such an embodiment, the clips are symmetrically positioned over the heatsink. The use of two or more clips may enhance the stability of the apparatus. It is important to note, however, that the present invention is not limited by the number of clips used to secure heatsink 220 to package 204. Moreover, it is appreciated that other types of flexible coupling mechanism may be used to secure the heatsink.

Figure 5:
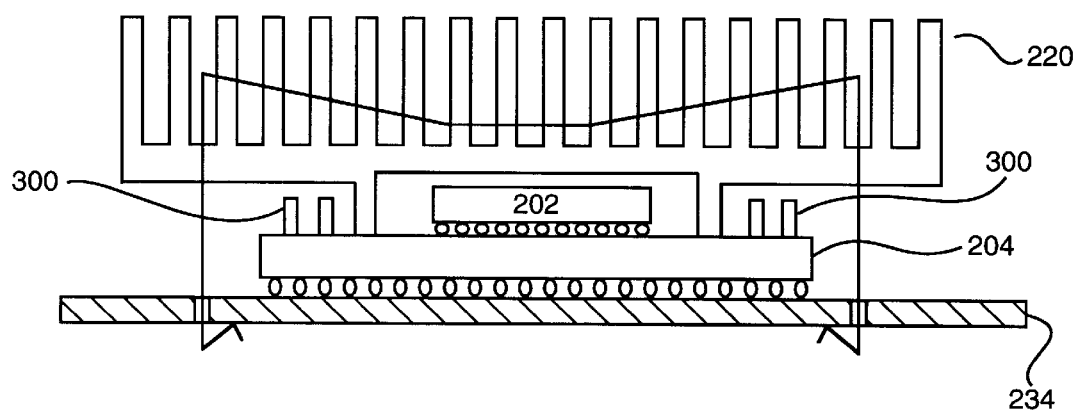
FIG. 5 illustrates the semiconductor device of FIG. 2 having other electrical components mounted to the top surface of the package substrate.

In addition to housing an integrated circuit die, a semiconductor package often serves as a platform for mounting other electronic or electrical devices necessary for the proper operation of the integrated circuit device. For example, in order to control ringing caused by noise, and a host of other electrical problems, decoupling capacitors are often mounted onto the package substrate where they are electrically coupled to the integrated circuit device. FIG. 5 shows package 204 having an array of Low Inductance Capacitor Arrays (LICAs) 300 mounted onto the top surface 206 of the package substrate. As illustrated, the present invention accommodates the placement of such devices onto the top surface of the package.

Thus, what has been described is an apparatus for removing heat from the backside of a packaged flip chip. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A semiconductor device comprising:
   a package substrate having a top surface and a bottom surface;
   an integrated circuit die having a top-side surface and a backside surface, said top-side surface of said die mounted to said top surface of said substrate via a plurality of solder bump interconnections;
   a heatsink supported above said die and said package substrate by standoffs, the height of said standoffs being selected such that a gap exists between said heatsink and said backside surface of said die, said standoffs making a point contact with said top surface of said package substrate;
   a compliant heat transfer medium filling said gap and contacting said heatsink and said backside surface of said die to provide a heat transfer path between said die and said heatsink; and
   flexible coupling means providing a force to said heatsink to seat said standoffs against said top surface of said substrate.

2. The semiconductor device of claim 1 wherein said standoffs are integral to said heatsink.

3. The semiconductor device of claim 1 wherein said heat transfer medium filling said gap comprises a thermal grease.

4. The semiconductor device of claim 1 wherein the width of said gap is held to within 0.003 to 0.005 inches.

5. The semiconductor device of claim 1 wherein said package substrate is part of a plastic land grid array (PLGA) package.

6. The semiconductor device of claim 1 wherein said heatsink is made of aluminum.

7. The semiconductor device of claim 1 wherein said coupling means comprises a spring clip that provides a force to said top surface of said heatsink to seat said standoffs against said top surface of said substrate.

8. The semiconductor device of claim 1 further comprising a printed circuit board having a top surface and a bottom surface and a plurality of through holes extending from said top surface to said bottom surface, said bottom surface of said package substrate being coupled to said top surface of said printed circuit board.

9. The semiconductor device of claim 8 wherein said coupling means comprises a spring clip having a pair of legs, each leg having a first end and a second end, said legs being spaced apart at their first ends by a contiguous connecting member, said member being pressed against the top surface of said heatsink, said second ends of said legs being secured within said through holes of said printed circuit board to provide a force to said heatsink to seat said standoffs against said top surface of said package substrate.

10. A semiconductor device comprising:
    a package substrate having a bottom surface and a planar top surface and an array of electrical contact pads disposed on said top surface;
    an integrated circuit die having a top-side surface, a planar backside surface and side surfaces, said top-side surface of said die mounted to said top surface of said substrate via a plurality of solder bump interconnections that electrically couple said die to said electrical contact pads, said backside surface being parallel to said top surface of said substrate;
    a heatsink comprising a baseplate having a top surface and a planar bottom surface, said bottom surface being substantially parallel to said backside surface of said die and supported above said die by standoffs that are positioned in close proximity to said side surfaces of said die, the height of said standoffs being selected such that a gap exists between said bottom surface of said baseplate and said backside surface of said die, said standoffs comprising columns positioned symmetrically about said die;
    a compliant heat transfer medium filling said gap and contacting said heatsink and said backside surface of said die to provide a heat transfer path between said die and said heatsink; and
    flexible coupling means providing a force to said heatsink to seat said standoffs against said top surface of said substrate.

11. The semiconductor device of claim 10 wherein said standoffs are integral to said heatsink baseplate.

12. The semiconductor device of claim 10 wherein said heat transfer medium filling said gap comprises a thermal grease.

13. The semiconductor device of claim 10 wherein the width of said gap is held to within 0.003 to 0.005 inches.

14. The semiconductor device of claim 10 wherein said package substrate is part of a plastic land grid array (PLGA) package.

15. The semiconductor device of claim 10 wherein said heatsink is made of aluminum.

16. The semiconductor device of claim 10 wherein said coupling means comprises a spring clip that provides a force to said top surface of said heatsink baseplate to seat said standoffs against said top surface of said substrate.

17. The semiconductor device of claim 10 further comprising a printed circuit board having a top surface and a bottom surface and a plurality of through holes extending from said top surface to said bottom surface, said bottom surface of said package substrate being coupled to said top surface of said printed circuit board.

18. The semiconductor device of claim 17 wherein said coupling means comprises a spring clip having a pair of legs, each leg having a first end and a second end, said legs being spaced apart at their first ends by a contiguous connecting member, said member being pressed against said top surface of said heatsink, said second ends of said legs being secured within said through holes of said printed circuit board to provide a force to said top surface of said heatsink baseplate to seat said standoffs against said top surface of said package substrate.

19. A semiconductor device comprising:

a package substrate having a bottom surface and a planar top surface and an array of electrical contact pads disposed on said top surface;

an integrated circuit die having a top-side surface, a planar backside surface and side surfaces, said top-side surface of said die mounted to said top surface of said substrate via a first plurality of solder bump interconnections that electrically couple said die to said electrical contact pads, said top-side and backside surfaces being parallel to said top surface of said substrate;

a printed circuit board having a top surface and a bottom surface and a plurality of through holes extending from said top surface to said bottom surface, said bottom surface of said package substrate being coupled to said top surface of said printed circuit board by a second plurality of solder bump interconnections;

a heatsink comprising a baseplate having a top surface and a planar bottom surface, said top surface having a plurality of spaced apart fins extending upward from said baseplate, said bottom surface being parallel to said backside surface of said die and supported above said die by standoffs that are positioned in close proximity to said side surfaces of said die, the height of said standoffs being selected such that a gap exists between said planar bottom surface of said baseplate and said planar backside surface of said dies said standoffs comprising columns positioned symmetrically about said die;

a thermal grease disposed in said gap, said thermal grease contacting said planar bottom surface of said baseplate and said planar backside surface of said die; and a spring clip having a pair of legs, each leg having a first end and a second end, said legs being spaced apart at their first ends by a contiguous connecting member, said member being pressed against said top surface of said heatsink, said second ends of said legs being secured within said through holes of said printed circuit board to provide a force to said top surface of said heatsink baseplate to seat said standoffs against said top surface of said substrate.

20. The semiconductor device of claim 19 wherein said standoffs are integral to said heatsink baseplate.

21. The semiconductor device of claim 19 wherein the width of said gap is held to within 0.003 to 0.005 inches.

22. The semiconductor device of claim 19 wherein said package substrate is part of a plastic land grid array (PLGA) package.

23. The semiconductor device of claim 19 wherein said heatsink is made of aluminum.

24. A semiconductor device comprising:

a package substrate having a top surface and a bottom surface;

an integrated circuit die having a top-side surface and a backside surface, said top-side surface of said die mounted to said top surface of said substrate via a plurality of solder bump interconnections;

a heatsink supported above said die and said package substrate by standoffs, the height of said standoffs being selected such that a gap exists between said heatsink and said backside surface of said die, said standoffs comprising columns positioned symmetrically about said die;

a compliant heat transfer medium filling said gap to provide a heat transfer path between said die and said heatsink; and flexible coupling means providing a force to said heatsink to seat said standoffs against said top surface of said substrate.

25. A semiconductor device comprising:

a package substrate having a bottom surface and a planar top surface and an array of electrical contact pads disposed on said top surface;

an integrated circuit die having a topside surface, a planar backside surface and side surfaces, said top-side surface of said die mounted to said top surface of said substrate via a plurality of solder bump interconnections that electrically couple said die to said electrical contact pads, said backside surface being parallel to said top surface of said substrate;

a heatsink comprising a baseplate having a top surface and a planar bottom surface, said bottom surface being substantially parallel to said backside surface of said die and supported above said die by standoffs that are positioned in close proximity to said side surfaces of said die, the height of said standoffs being selected such that a gap exists between said bottom surface of said baseplate and said backside surface of said die, said standoffs making a point contact with said top surface of said package substrate;

a compliant heat transfer medium filling said gap and contacting said heatsink and said backside surface of said die to provide a heat transfer path between said die and said heatsink; and flexible coupling means providing a force to said heatsink to seat said standoffs against said top surface of said substrate.

26. A semiconductor device comprising:

a package substrate having a bottom surface and a planar top surface and an array of electrical contact pads disposed on said top surface;

an integrated circuit die having a top-side surface, a planar backside surface and side surfaces, said top-side surface of said die mounted to said top surface of said substrate via a first plurality of solder bump interconnections that electrically couple said die to said electrical contact pads, said top-side and backside surfaces being parallel to said top surface of said substrate;

a printed circuit board having a top surface and a bottom surface and a plurality of through holes extending from said top surface to said bottom surface, said bottom surface of said package substrate being coupled to said top surface of said printed circuit board by a second plurality of solder bump interconnections;

a heatsink comprising a baseplate having a top surface and a planar bottom surface, said top surface having a plurality of spaced apart fins extending upward from said baseplate, said bottom surface being parallel to said backside surface of said die and supported above said die by standoffs that are positioned in close proximity to said side surfaces of said die, the height of said standoffs being selected such that a gap exists between said planar bottom surface of said baseplate and said planar backside surface of said die die, said standoffs making a point contact with said top surface of said package substrate;

a thermal grease disposed in said gap, said thermal grease contacting said planar bottom surface of said baseplate and said planar backside surface of said die; and a spring clip having a pair of legs, each leg having a first end and a second end, said legs being spaced apart at their first ends by a contiguous connecting member, said member being pressed against said top surface of said heatsink, said second ends of said legs being secured within said through holes of said printed circuit board to provide a force to said top surface of said heatsink baseplate to seat said standoffs against said top surface of said substrate.

* * * * *